United States Patent
Koga et al.

(10) Patent No.: US 6,358,124 B1
(45) Date of Patent: *Mar. 19, 2002

(54) PAD CONDITIONER CLEANING APPARATUS

(75) Inventors: Raijiro Koga, Tsuchiura; Hiromi Tsuruta, Sakura; Takashi Kumagai, Yokohama, all of (JP); Gee Hoey, San Jose, CA (US); Brian J. Brown, Palo Alto, CA (US); Boris Fishkin, San Carlos, CA (US); Fred C. Redeker, Fremont, CA (US); Bruce Lu, Hsin-Chu (TW); Rex Lu, Hsin-Chu (TW); K. Y. Wang, Hsin-Chu (TW); Roland Shu, Hsin-Chu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/222,180

(22) Filed: Dec. 29, 1998

Related U.S. Application Data (63) Continuation-in-part of application No. 09/184,786, filed on Nov. 2, 1998.

(51) Int. Cl.⁷ .................................................. B24B 1/00
(52) U.S. Cl. ......................................... 451/56; 451/444
(58) Field of Search .................................. 451/285, 288, 451/289, 290, 292, 247, 401, 332, 41, 56, 444, 446, 449, 450, 451, 453, 455

(56) References Cited

U.S. PATENT DOCUMENTS

| | | | |
|---|---|---|---|
| 5,081,051 A | 1/1992 | Mattingly et al. | 437/10 |
| 5,216,843 A | 6/1993 | Breivogel et al. | 51/131 |
| 5,456,627 A | 10/1995 | Jackson et al. | 451/11 |
| 5,486,131 A | 1/1996 | Cesna et al. | 451/56 |
| 5,531,635 A | 7/1996 | Mogi et al. | 451/72 |
| 5,626,509 A | 5/1997 | Hayashi | 451/285 |
| 5,738,574 A | 4/1998 | Tolles et al. | 451/288 |
| 5,839,947 A | 11/1998 | Kimura et al. | 451/288 |
| 6,053,801 A | 4/2000 | Pinson et al. | |

FOREIGN PATENT DOCUMENTS

WO    WO 99/02305    1/1999

OTHER PUBLICATIONS

U.S. Application Serial No. 09/184,766, entitled "Pad Conditioner Cleaning Apparatus", filed Nov. 2, 1998.

*Primary Examiner*—Derris H. Banks
(74) *Attorney, Agent, or Firm*—Fish & Richardson (57) ABSTRACT

A chemical mechanical polishing apparatus includes a pad conditioner having a conditioner head, a cleaning cup for receiving and cleaning the conditioner head of the pad conditioner, and a fluid dispenser for dispensing a cleaning fluid onto the conditioner head.

34 Claims, 5 Drawing Sheets

PAD CONDITIONER CLEANING APPARATUS

CROSS-REFERENCE TO RELATED APPLICATIONS

This is a continuation-in-part application of pending U.S. application Ser. No. 09/184,786, filed on Nov. 2, 1998, the entirety of which is incorporated herein by reference.

BACKGROUND

The present invention relates generally to chemical mechanical polishing of substrates and, more particularly to a polishing pad conditioner cleaning apparatus.

Integrated circuits are typically formed on substrates, particularly silicon wafers, by the sequential deposition of conductive, semiconductive or insulative layers. Specific structures and devices are formed by preferential etching of the layers aided by photolithography. High resolution and accurate focusing of the photolithography apparatus allows the formation of well defined micro- or nano-structures. Accurate focusing of the photolithography apparatus is difficult for non-planar surfaces. Therefore, there is a need to periodically planarize the substrate surface to provide a planar surface. Planarization, in effect, polishes away a non-planar, outer surface, whether a conductive, semiconductive, or insulative layer, to form a relatively flat, smooth surface.

Chemical mechanical polishing (CMP) is one accepted method of planarization. This planarization method typically requires that the substrate be mounted on a carrier or polishing head, with the surface of the substrate to be polished exposed. The substrate is then placed against a rotating polishing pad. The carrier head provides a controllable load, i.e., pressure, on the substrate to push it against the polishing pad. In addition, the carrier head may rotate to provide additional motion between the substrate and polishing surface. Further, a polishing slurry, including an abrasive and at least one chemically-reactive agent, may be spread on the polishing pad to provide an abrasive chemical solution at the interface between the pad and substrate.

The effectiveness of a CMP process may be measured by its polishing rate, and by the resulting finish (absence of small-scale roughness) and flatness (absence of large-scale topography) of the substrate surface. Inadequate flatness and finish can produce substrate defects. The polishing rate, finish and flatness are determined by the pad and slurry combination, the relative speed between the substrate and pad, and the force pressing the substrate against the pad. The polishing rate sets the time needed to polish a layer. Thus, it sets the maximum throughput of the polishing apparatus.

It is important to take appropriate steps to counteract any deteriorative factors which may either damage the substrate (such as by scratches resulting from accumulated debris in the pad) or reduce polishing speed and efficiency (such as results from glazing of the pad surface after extensive use). The problems associated with scratching the substrate surface are self-evident. The more general pad deterioration problems both decrease polishing efficiency, which increase cost, and create difficulties in maintaining consistent operation from substrate to substrate as the pad decays.

The glazing phenomenon is a complex combination of contamination, thermal, chemical and mechanical damage to the pad material. When the polisher is in operation, the pad is subject to compression, shear and friction producing heat and wear. Slurry and abraded material from the wafer and pad are pressed into the pores of the pad material and the material itself becomes matted and even partially fused. These effects reduce the pad's roughness and its ability to efficiently polish the substrate.

It is, therefore, desirable to continually condition the pad by removing trapped slurry, and unmatting or re-expanding the pad material.

A number of conditioning procedures and apparatus have been developed. A conventional conditioner has an arm holding a conditioner head with an abrasive disk facing the polishing pad. A bearing system rotatably supports the abrasive disk at the end of the arm. The abrasive disk rotates against the polishing pad to physically abrade the polishing pad and remove the glazing layer from the polishing pad.

While the abrasive disk is rotating against the polishing pad, slurry will tend to coat the conditioner head. However, when the conditioner head is not operating, e.g., between polishing operations or due to maintenance, the slurry on conditioner head will tend to dry out. As the slurry dries, it tends to form a hardened "caked" surface, and sodium hydroxide in the slurry tends to crystallize. The resulting solidified slurry particles may fall off the conditioner head onto the polishing pad. These particles may scratch the wafer during polishing. The CMP apparatus can include a cleaning cup for removing slurry deposits from a conditioner head. Unfortunately, some wafer scratching persists.

The slurry solidification problem has been associated generally with the abrasive disk of the conditioner head since it is the part of the conditioner head that physically contacts the polishing pad. In reality, the slurry may be splashed on other parts of the conditioner head, e.g., a top side of the conditioner head.

In view of the above, there is room for improvement in cleaning of the conditioner head.

SUMMARY

In general, in one aspect, the present invention features a chemical mechanical polishing apparatus including a pad conditioner having a conditioner head, and a cleaning cup having a base and a wall extending upward from the base for receiving and cleaning the conditioner head. The cleaning cup includes a spray nozzle to spray a cleaning fluid onto the conditioner head.

Implementations of the invention may include one or more of the following features. The cleaning cup further includes a first passage for directing the cleaning fluid to the spray nozzle. The cleaning cup further includes a spray nozzle support having a second passage. The spay nozzle support supports the spray nozzle. The first passage is connected to the second passage to direct the cleaning fluid to the spray nozzle. The cleaning cup further includes a cleaning solution passage for continuously supplying the cleaning cup with a cleaning solution. The cleaning cup further includes at least one drain to drain the cleaning solution from the cleaning cup. The cleaning solution in the cleaning cup is maintained at a substantially constant level. The cleaning cup further includes a plurality of support pins extending upward from the base to support the conditioner head thereon and provide a space between the conditioner head and the base for the flow of cleaning solution therebetween. The cleaning fluid may be deionized water or air. The cleaning cup includes a plurality of spray nozzles. The spray nozzle sprays a cleaning fluid on a top side of the conditioner head.

In another aspect, a chemical mechanical polishing apparatus includes a pad conditioner having a conditioner head, a cleaning cup having a base and a wall extending upward from the base for receiving and cleaning the conditioner head and a cleaning fluid dispenser to provide a flowing cleaning fluid to a top side of the conditioner head.

In another aspect, the invention is a method of cleaning a chemical mechanical polishing apparatus. In the method, a conditioner head of a pad conditioner is placed in a cleaning cup, and a cleaning fluid is provided to a top side of the conditioner head.

Implementations of the invention may include the following. The cleaning fluid may be provided to a drive shaft or an arm of the pad conditioner.

In another aspect, the invention is a chemical mechanical polishing apparatus which includes a pad conditioner having a conditioner head, a cleaning cup having a base and a wall extending upward from the base for receiving and cleaning the conditioner head, and a plurality of fluid dispensers to dispense a cleaning fluid onto the conditioner head and another part of the pad conditioner.

Implementations of the invention may include one or more of the following features. One of the fluid dispensers may be placed on the base of the cleaning cup to face a bottom side of the conditioner head. The cleaning fluid may be dispensed to a shaft of the pad conditioner. The pad conditioner and the cleaning cup may be mounted on a table top and at least one of the fluid dispensers may be placed on the table top to dispense the cleaning fluid on an arm of the pad conditioner.

In another aspect, the invention is a chemical mechanical polishing apparatus which includes a pad conditioner having a conditioner head, a cleaning cup having a base and a wall extending upward from the base for receiving and cleaning the conditioner head, and a fluid dispenser placed on the base of the cleaning cup to spray a cleaning fluid toward a bottom side of the conditioner head placed in the cleaning cup.

In another aspect, the invention is directed to a method of cleaning a chemical mechanical polishing apparatus in which a conditioner head of a pad conditioner is placed in a cleaning cup, and a cleaning fluid is provided to the conditioner head and another part of the pad conditioner.

Advantages of the invention may include one or more of the following. The invention provides a cleaning apparatus which can clean the entire conditioner head. The invention also provides a reliable means of cleaning an abrasive disk without undue risk of contaminating the abrasive disk. The invention also provides a cleaning apparatus which can clean other parts of the pad conditioner.

Other features and advantages of the invention will be apparent from the following description of the preferred embodiments, and from the claims.

BRIEF DESCRIPTION OF THE DRAWINGS

Like reference numbers are designated in the various drawings to indicate like elements. A primed reference number indicates that an element has a modified function, operation or structure.

DETAILED DESCRIPTION

Figure 1:
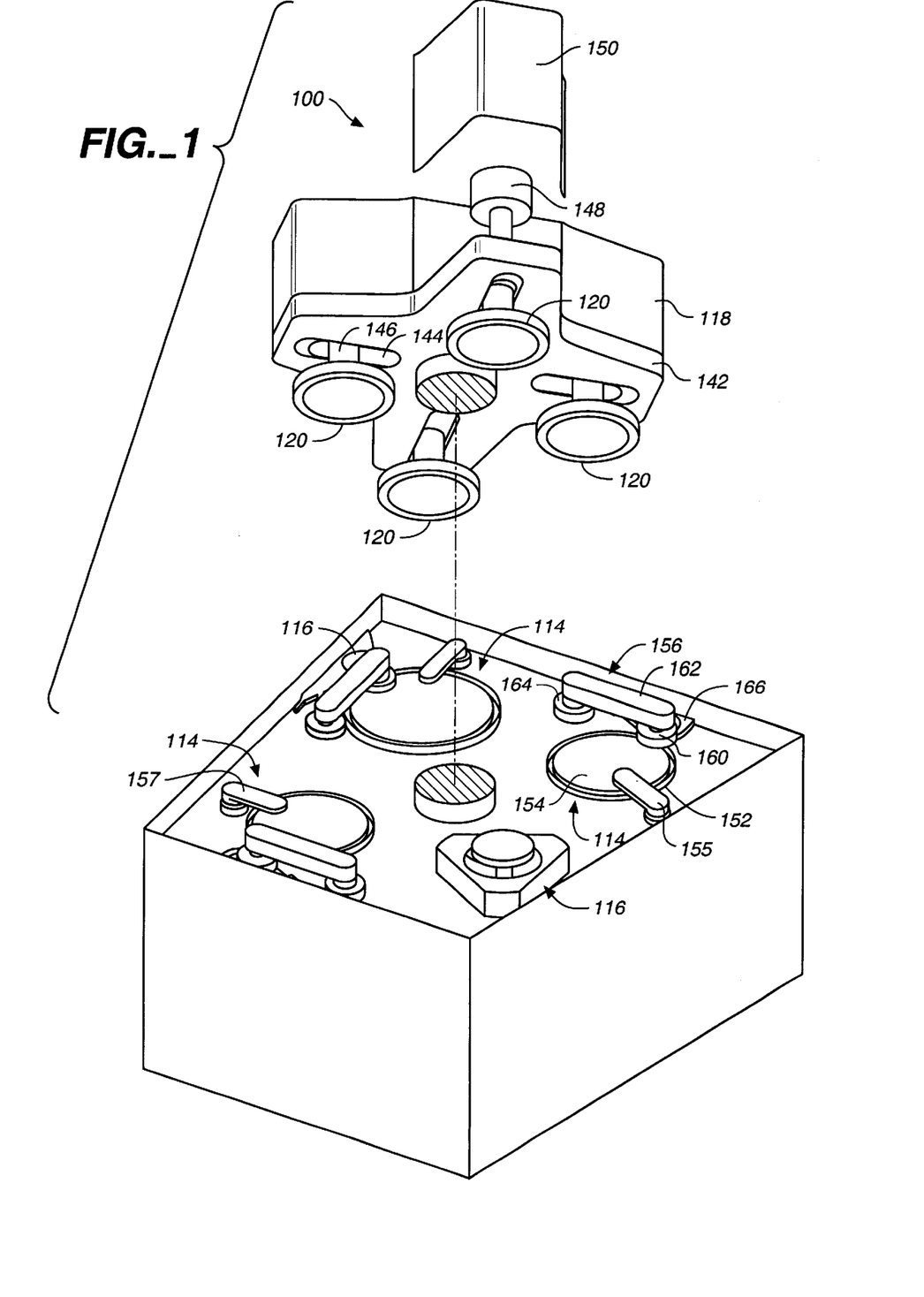
FIG. 1 is a schematic exploded perspective view of a chemical mechanical polishing apparatus.

Referring to FIG. 1, a chemical mechanical polishing apparatus 100 includes three independently-operated polishing stations 114, a substrate transfer station 116, and a rotatable carousel 118 which choreographs the operation of four independently rotatable carrier heads 120. A more detailed description of a similar polishing apparatus 100 may be found in U.S. Pat. No. 5,738,574, the entire disclosure of which is incorporated herein by reference.

The carousel 118 has a support plate 142 with slots 144 through which drive shafts 146 extend to support the carrier heads 120. The carrier heads 120 can independently rotate and oscillate back-and-forth in the slots 144 to produce a uniformly polished substrate surface. The carrier heads 120 are rotated by respective motors 148, which are normally hidden behind a removable cover 150 (one quarter of which is removed in FIG. 1) of the carousel 118. In operation, a substrate is loaded onto the transfer station 116, from which the substrate is transferred to a carrier head 120. The carousel 118 then transfers the substrate through a series of one or more polishing stations 114 and finally returns the polished substrate to the transfer station 116.

Each polishing station 114 includes a rotatable platen 152 which supports a polishing pad 154, a combined slurry delivery/rinse arm 155, and a pad conditioner apparatus 156. Each polishing station 114 also includes a cleaning cup 166 that contains a cleaning solution, such as deionized water or another fluid, for rinsing or cleaning part of the pad conditioner 156. The platen 152, the slurry delivery/rinse arm 155, the pad conditioner 156, and the cleaning cup 166 are mounted onto a table top 157.

Each slurry/rinse arm 155 supplies slurry to an associated polishing pad 154 to facilitate the wafer polishing operation. In addition, the slurry/rinse arm can supply water to the polishing pad 154 to keep the polishing pad clean.

Figure 2:
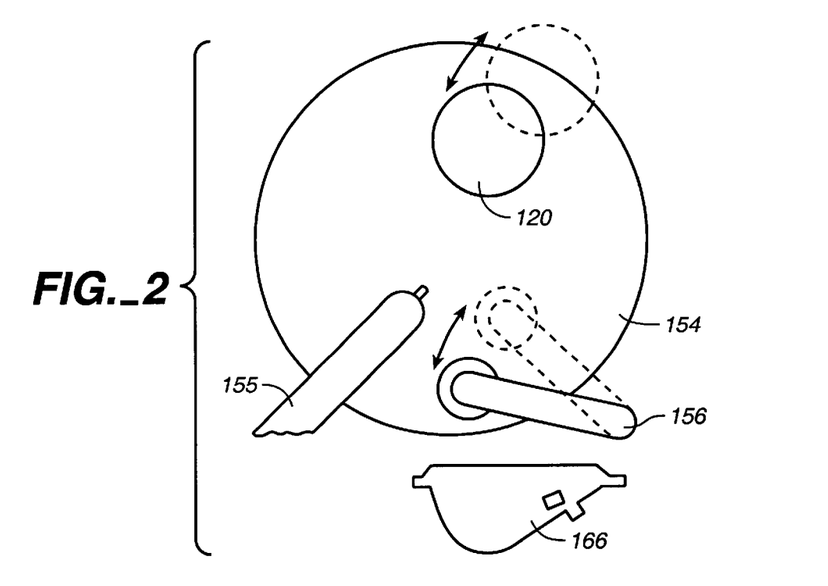
FIG. 2 is a top view of a polishing station wherein a pad conditioner is conditioning a polishing pad while a wafer is being polished on the polishing pad.
Figure 3:
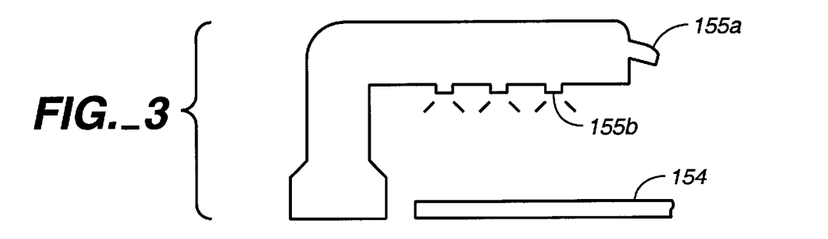
FIG. 3 is a side view of a slurry/rinse arm spraying water onto a polishing pad.

As shown in FIGS. 2 and 3, the slurry/rinse arm 155 includes a slurry nozzle 155a for supplying slurry to the polishing pad 154. The slurry/rinse arm 155 also includes a plurality of water nozzles 155b to spray water over the polishing pad 154 to clean the polishing pad 154.

Figure 8:
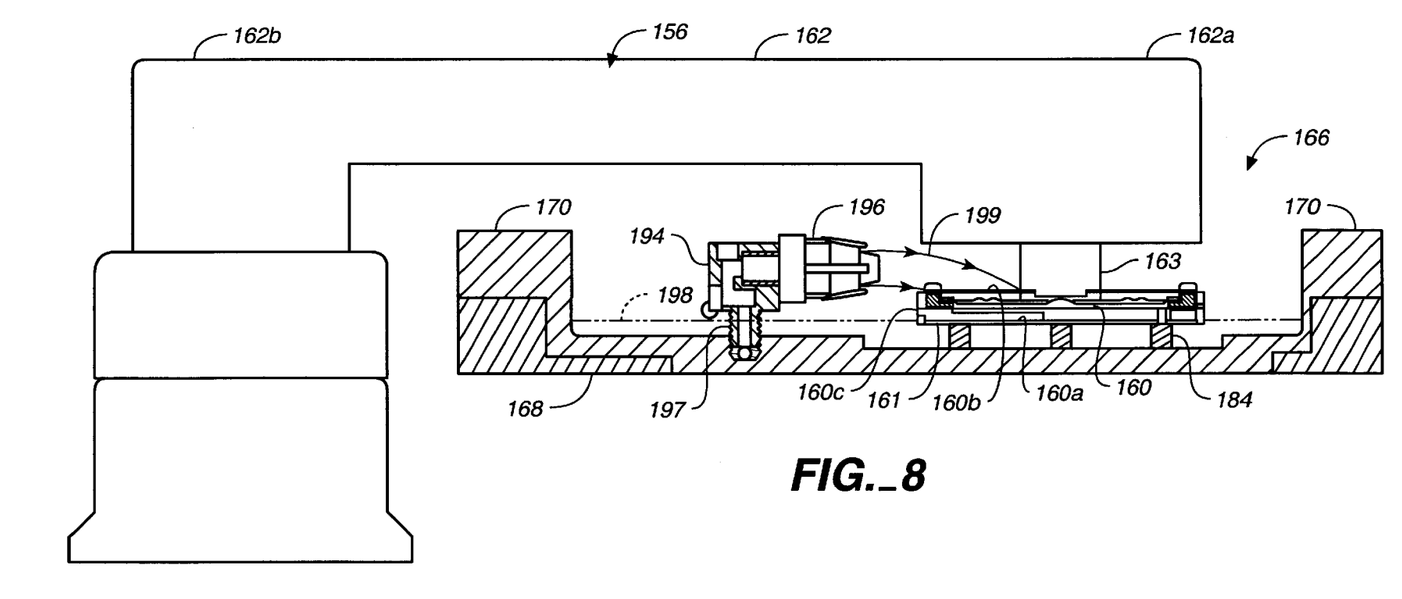
FIG. 8 is a cross sectional view of a cleaning cup illustrating a conditioner head placed in the cleaning cup, according to an embodiment of the present invention.

Referring to FIGS. 1 and 8, each pad conditioner 156 includes an arm 162 that supports a conditioner head 160 over the polishing station. The arm 162 is rotatably secured to the table top 157 at a base 164. The conditioner head 160 includes a circular bottom side 160a, a circular top side 160b, and side walls 160c generally extending from the top side 160b to the bottom side 160a. The bottom side 160a faces the polishing pad 154 and supports or includes an abrasive conditioning disk 161. A distal end 162a of the arm 162 is coupled to the conditioner head 160, and a proximal end 162b of the arm 162 is coupled to the base 164. The base 164 can rotate to pivot the arm 162 and thus move the abrasive disk 161 across the surface of the polishing pad 154. A more complete description of a similar pad conditioner apparatus may be found in U.S. patent application Ser. No. 09/052,798, filed Mar. 31, 1998, entitled Chemical Mechanical Polishing Conditioner, by Gurusamy et al., the entire disclosure of which is incorporated herein by reference.

Figure 4:
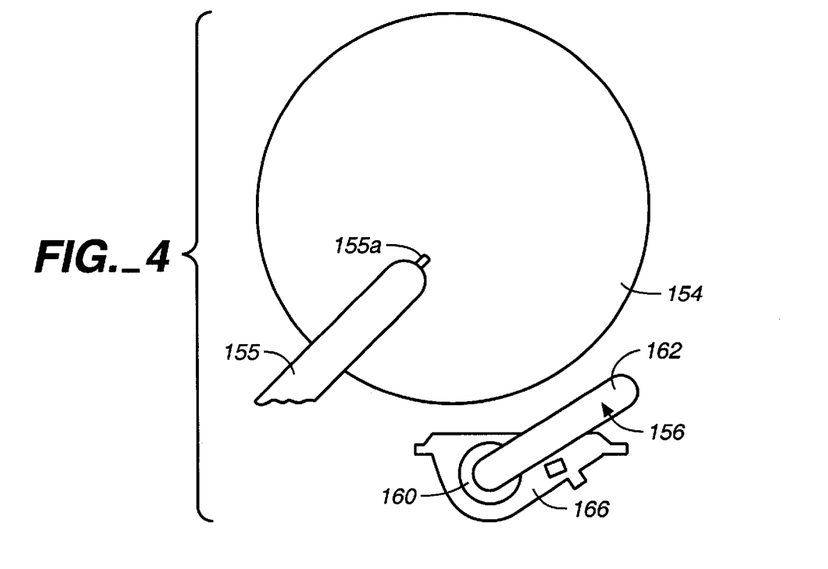
FIG. 4 shows a pad conditioner rotated off a polishing pad and placed in a cleaning cup while pad conditioning is not being performed.

As shown in FIG. 4, between conditioning operations, the pad conditioner arm 162 pivots to move the conditioner head 160 off the polishing pad 154 and into the cleaning cup 166. In one embodiment, the water nozzles 155b of the slurry/rinse arm 155 remain on when the conditioner head 160 is removed from the polishing pad 154 and inserted into the cleaning cup 166. Alternatively, the water nozzles 155b of the slurry/rinse arm 155 may be deactivated when the conditioner head 160 is placed in the cleaning cup 166.

Figure 5:
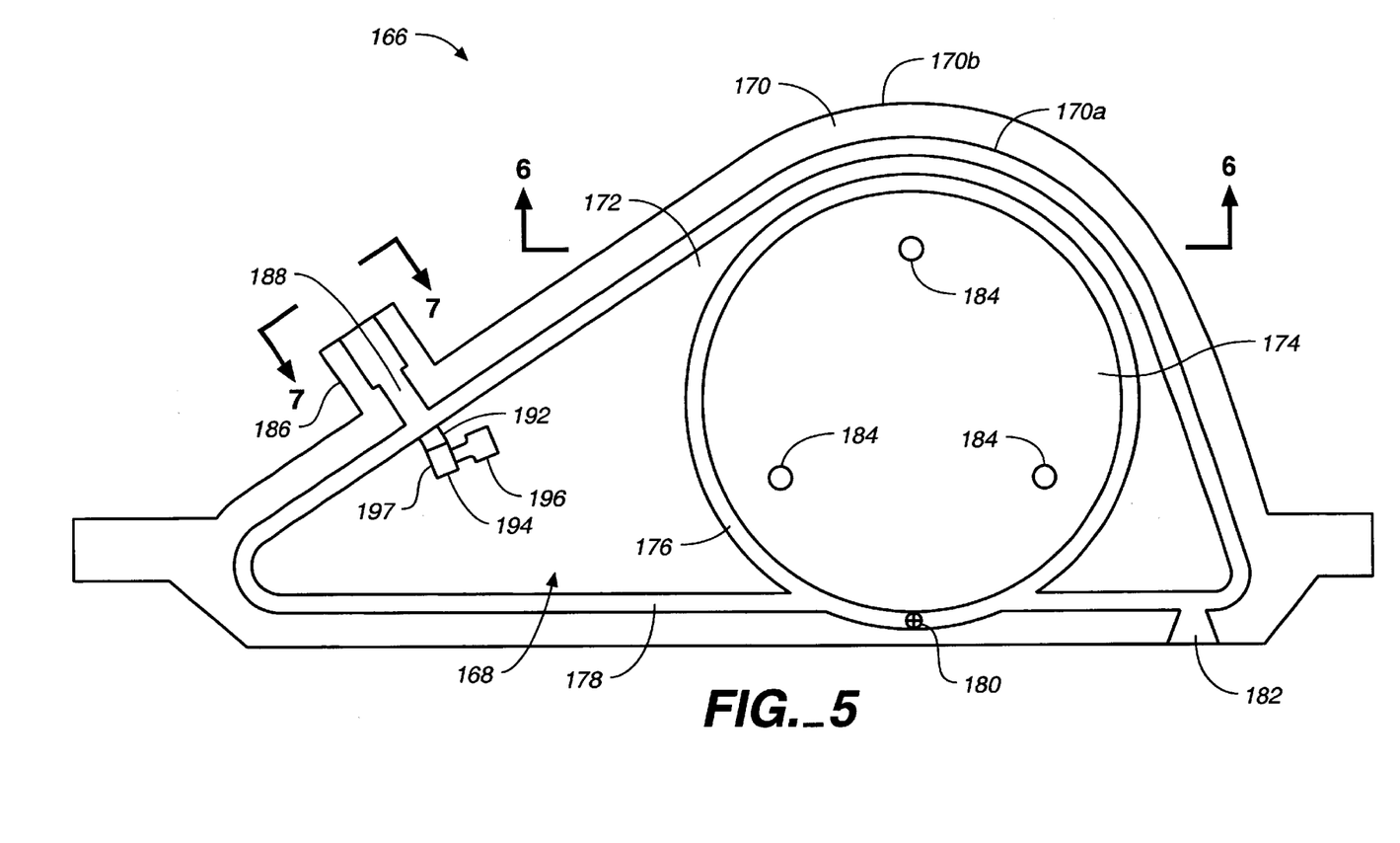
FIG. 5 is top view of a cleaning cup according to an embodiment of the present invention.
Figure 6:
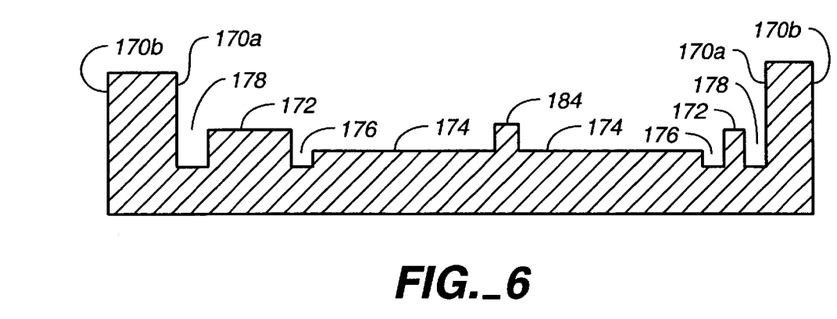
FIG. 6 is a cross sectional view of the cleaning cup along line 6—6 of FIG. 5.

Referring to FIGS. 5 and 6, the cleaning cup 166 includes a generally triangular-shaped base 168 and a sidewall 170 which extends upwardly from the perimeter of the base 168. The sidewall 170 includes an inner wall 170a and an outer wall 170b. The base 168 and the inner wall 170a define a triangular-shaped basin for receiving the pad conditioner head 160.

The base 168 includes a lower base portion 174 portion and an upper base portion 172. The upper base portion 172 is at a higher elevation than the lower base portion 174. A main channel 178 separates the upper base portion 172 from the sidewall 170. A main drain 182 may be positioned adjacent to a corner of the base 168 and connected to the main channel 178 to drain cleaning fluid from the cleaning cup 166. Of course, the main drain 182 may be placed in other areas as well. An annular channel 176 is provided to define a border between the upper base portion 172 and the lower base portion 174. An annular channel drain 180 is coupled to the annular channel 176.

The lower base portion 174 is designed to receive the abrasive disk 161 of the conditioner head 160. The lower base portion 174 is a circular shape to correspond to the shape of the abrasive disk 161 and the conditioner head 160. Three support pins 184 protrude upwardly from the lower base 174. The support pins 184 define the vertices of a triangle. The sides of the triangle defined by the support pins 184 are preferably equal in length. The support pins 184 provide a stable support to receive the abrasive disk 161 and the conditioner head 160. The pins 184 also provide a space between the lower base portion 174 and the abrasive disk 161 so that a cleaning fluid may flow therebetween to clean the abrasive disk 161.

Figure 7:
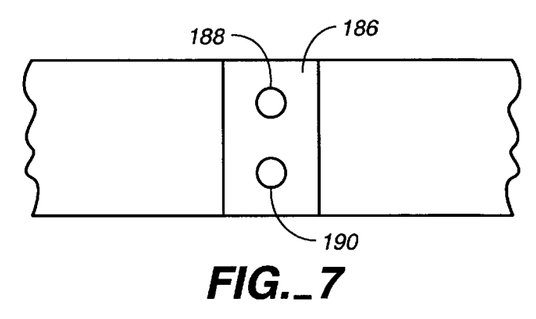
FIG. 7 is a front view of a protrusion in a sidewall of the cleaning cup along line 7—7 of FIG. 5.

A protrusion 186 extends outwardly from the sidewall 170. As shown in FIG. 7, the protrusion 186 has two passages 188 and 190 arranged vertically for introducing cleaning solution into the cleaning cup 166. The upper passage 188 extends from the front of the protrusion 186 and ends at the inner wall 170a. The upper passage 188 is connected to a first cleaning solution supply (not shown) by a first tube (not shown), and continuously replenishes the cleaning solution in the cleaning cup 166. The main drain 182 and the annular channel drain 180 are used to drain the cleaning fluid from the cleaning cup 166 so that a substantially constant level of cleaning solution 167 (see FIG. 8) is maintained in the cleaning cup 166.

The lower passage 190 extends from the front of the protrusion 186, continues under a portion 192 of the upper base 172, and ends with a spray opening 197 on the upper base 172. The lower passage 190 is connected to a second cleaning fluid supply (not shown) by a second tube (not shown).

Referring to FIGS. 5 and 8, an L-shaped spray nozzle support 194 having a passage 193 therethrough is fitted into the spray opening 197. A spray nozzle 196 is connected to an end of the spray nozzle support 194. The spray nozzle support 194 is of sufficient length to enable the spray nozzle 196 to be positioned slightly above the top side 160b of the conditioner head 160 when the conditioner head 160 is located in the cleaning cup 166.

As discussed, between conditioning operations, the conditioner head 160 is placed inside the cleaning cup 166, and the abrasive disk 161 is placed on the support pins 184. A level 198 of cleaning solution 167 in the cleaning cup 166 is maintained so that the cleaning solution 167 is slightly above the abrasive disk 161, but is below the top side 160b and upper parts of the side walls 160c of the conditioner head 160. The spray nozzle 196 is positioned above the conditioner head 160 to spray a cleaning solution 199 on the top side 160b and the upper portions of the side wall 160c of the conditioner head 160 to remove any slurry deposits therefrom. Specifically, slurry deposits on the side walls of the conditioner head 160 may be removed by a spray from the spray nozzle 196, or by the flowing action of the cleaning solution as it drains off the top side 160a of the conditioner head 160 and flows down along the side walls 160c. Slurry deposits on other parts of the pad conditioner 156, e.g., a shaft 163 coupling the conditioner head 160 and the arm 162, may also be removed by adjusting the position of the spray nozzle 196.

Although only one spray nozzle has been described in the above embodiment, additional spay nozzles may be placed in the cleaning cup 166 to more effectively clean the pad conditioner 156. In addition, although the spray nozzle 196 has been described as positioned inside the cleaning cup 166, the spray nozzle 196 may be positioned in other locations, e.g., outside and extending over the cleaning cup 166.

Figure 9:
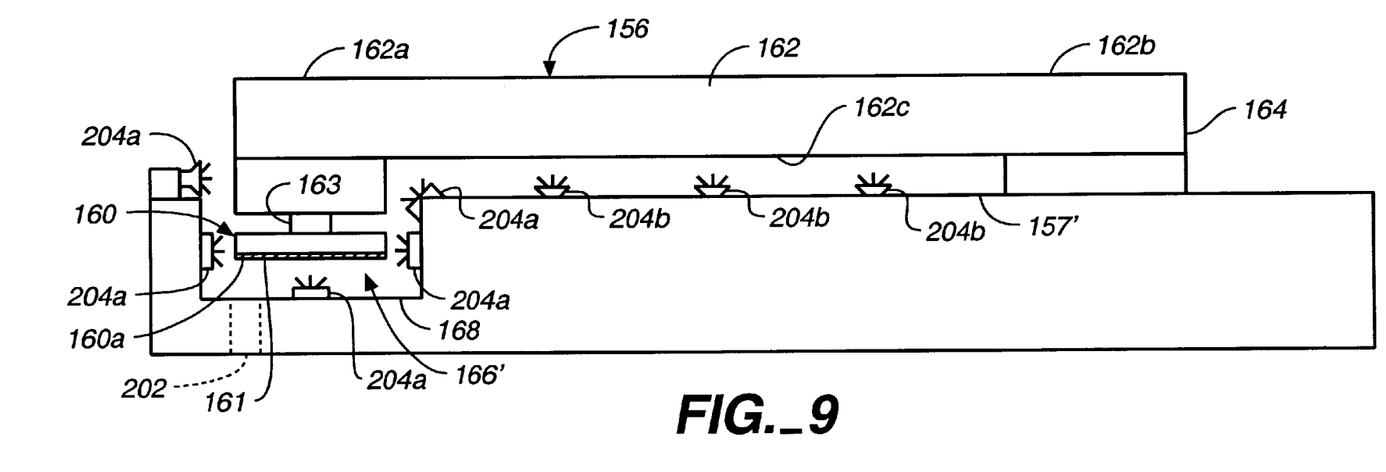
FIG. 9 shows a side view of a pad conditioner apparatus placed in a cleaning cup and being cleaned with a plurality of fluid dispensers.

Referring to FIG. 9, in another embodiment of the present invention, a plurality of fluid dispensers 204a and 204b (e.g., spray nozzles) positioned in and about the cleaning cup 166' and on the table top 157' may be used to clean other parts of the pad conditioner 156 as well as the conditioner head 160. The fluid dispensers spray cleaning fluid on various parts of the pad conditioner 156 to remove slurry or any contaminant thereon to clean the entire pad conditioner 156. The cleaning fluid may be air or a cleaning solution such as deionized water or both. The fluid dispensers 204a, 204b may include at least one fluid dispenser that only dispense air and at least one fluid dispenser that only dispense the cleaning solution.

FIG. 9 shows a side view of the pad conditioner 156 placed in the cleaning cup 166' and being cleaned with the fluid dispensers 204a, 204b. A first set of fluid dispensers 204a may be placed in or about the cleaning cup to clean the conditioner head 160 and parts of the pad conditioner 156 adjacent to the conditioner head 160 including the shaft 163 of the pad conditioner. At least one fluid dispenser 204a from the first set is placed at the base 168 of the cleaning cup 166', positioned to spray the cleaning fluid on the abrasive disk 161 that is coupled to the bottom side 160a of the conditioner head 160. A second set of one or more fluid dispensers 204b may be placed on the table top 157' to clean an underside of the arm 162 when the conditioner head 160 is placed in the cleaning cup 166'. A fluid drain 202 extends through the base to drain the cleaning cup 166'.

The pad conditioner 156 and the cleaning cup 166' of FIG. 9 are configured to hold the conditioner head 160 at a sufficient distance above the base 168 of the cleaning cup 166' to allow at least one fluid dispenser 204a from the first set to spray cleaning fluid to the abrasive disk 161. Note the cleaning cup 166' of FIG. 9 need not include the support pins 184 since the conditioner head 160 is suspended above the base 168 of the cleaning cup.

Although the mechanism for directing the cleaning solution has been described as a spray nozzle, other types of fluid dispensers may be used. For example, the fluid dispenser may introduce the cleaning fluid to the pad conditioner without actually spraying the cleaning fluid, e.g., by pouring the cleaning fluid to the pad conditioner.

Furthermore, a cleaning solution other than deionized water may be used to remove slurry deposits on the pad conditioner 156. For example, the spray nozzles may also spray air or spray both the cleaning solution and air.

The present invention has been described in terms of a preferred embodiment. The invention, however, is not limited to the embodiment depicted and described. Rather, the scope of the invention is defined by the appended claims.

What is claimed is:

1. A chemical mechanical polishing apparatus, comprising:
   a pad conditioner having a conditioner head; and
   a cleaning cup having a base and a wall extending upward from the base for receiving and cleaning the conditioner head, the cleaning cup including a spray nozzle to spray a cleaning fluid onto the conditioner head.

2. The apparatus of claim 1, wherein the cleaning cup further includes a first passage for directing the cleaning fluid to the spray nozzle.

3. The apparatus of claim 2, wherein the cleaning cup further includes a spray nozzle support having a second passage, the spay nozzle support supporting the spray nozzle and the first passage being connected to the second passage to direct the cleaning fluid to the spray nozzle.

4. The apparatus of claim 1, wherein the cleaning cup further includes a passage for continuously supplying the cleaning cup with a cleaning liquid.

5. The apparatus of claim 4, wherein the cleaning cup further includes at least one drain to drain the cleaning liquid from the cleaning cup.

6. The apparatus of claim 5, wherein the cleaning liquid in the cleaning cup is maintained at a substantially constant level.

7. The apparatus of claim 4, wherein the cleaning cup further includes a plurality of support pins extending upward from the base to support the conditioner head thereon and provide a space between the conditioner head and the base for the flow of the cleaning liquid therebetween.

8. The apparatus of claim 1, wherein the cleaning fluid is deionized water.

9. The apparatus of claim 1, wherein the cleaning fluid is air.

10. The chemical mechanical polishing apparatus of claim 1, wherein the cleaning cup includes a plurality of spray nozzles.

11. The apparatus of claim 1, wherein the spray nozzle sprays a cleaning fluid on a top side of the conditioner head.

12. A chemical mechanical polishing apparatus, comprising:
    a pad conditioner having a conditioner head;
    a cleaning cup having a base and a wall extending upward from the base for receiving and cleaning the conditioner head; and
    a cleaning fluid dispenser positioned to provide a flowing cleaning fluid onto a top side of the conditioner head.

13. The apparatus of claim 12, wherein the cleaning cup further includes a passage for continuously supplying the cleaning cup with a cleaning liquid.

14. The apparatus of claim 13, wherein the cleaning cup further includes at least one drain to drain the cleaning liquid from the cleaning cup.

15. The apparatus of claim 14, wherein the cleaning liquid in the cleaning cup is maintained at a substantially constant level.

16. The apparatus of claim 13, wherein the cleaning cup further includes a plurality of support pins extending upward from the base to support the conditioner head thereon and provide a space between the conditioner head and the base for the flow of the cleaning liquid therebetween.

17. The apparatus of claim 12, wherein the cleaning fluid is deionized water.

18. A method of cleaning a chemical mechanical polishing apparatus, comprising:
    placing a pad conditioner including a conditioner head in a cleaning cup; and
    providing a cleaning fluid onto a top side of the conditioner head.

19. The method of claim 18, further comprising providing the cleaning fluid to a drive shaft of the pad conditioner.

20. The method of claim 18, further comprising providing the cleaning fluid to an arm of the pad conditioner.

21. A chemical mechanical polishing apparatus, comprising:
    a pad conditioner having a conditioner head;
    a cleaning cup having a base and a wall extending upward from the base for receiving and cleaning the conditioner head; and
    a plurality of fluid dispensers to dispense a cleaning fluid onto the conditioner head and at least one part selected from a conditioner head drive shaft and an arm that supports the conditioner head.

22. The apparatus of claim 21, wherein one of the fluid dispensers is placed on the base of the cleaning cup to face a bottom side of the conditioner head.

23. The apparatus of claim 21, wherein the another part of the pad conditioner is the conditioner head drive shaft.

24. The apparatus of claim 21, wherein the another part of the pad conditioner is the arm that supports the conditioner head.

25. The apparatus of claim 21, wherein at least one of the fluid dispensers dispenses air.

26. The apparatus of claim 21, wherein at least one of the fluid dispensers dispenses deionized water.

27. The apparatus of claim 21, wherein at least one of the fluid dispensers dispenses both air and deionized water.

28. The apparatus of claim 21, wherein the pad conditioner and the cleaning cup are mounted on a table top and at least one of the fluid dispensers is placed on the table top to dispense the cleaning fluid on the arm of the pad conditioner.

29. A chemical mechanical polishing apparatus, comprising:
    a pad conditioner having a conditioner head;
    a cleaning cup having a base and a wall extending upward from the base for receiving and cleaning the conditioner head; and
    a fluid dispenser placed on the base of the cleaning cup to spray a cleaning fluid toward a bottom side of the conditioner head placed in the cleaning cup.

30. A method of cleaning a chemical mechanical polishing apparatus, comprising the steps of:
   placing a conditioner head of a pad conditioner in a cleaning cup; and
   providing a cleaning fluid to the conditioner head and at least one part selected from a conditioner head drive shaft and an arm that supports the conditioner head.

31. A method of cleaning a chemical mechanical polishing apparatus, comprising:
   placing a pad conditioner including a conditioner head in a cleaning cup; and
   providing a cleaning fluid to the conditioner head and a drive shaft of the pad conditioner.

32. A method of cleaning a chemical mechanical polishing apparatus, comprising:
   placing a pad conditioner including a conditioner head in a cleaning cup; and
   providing a cleaning fluid to the conditioner head and an arm of the pad conditioner.

33. A chemical mechanical polishing apparatus, comprising:
   a pad conditioner having a conditioner head;
   a cleaning cup having a base and a wall extending upward from the base for receiving and cleaning the conditioner head; and
   a plurality of fluid dispensers to dispense a cleaning fluid onto the conditioner head and a conditioner head drive shaft.

34. A chemical mechanical polishing apparatus, comprising:
   a pad conditioner having a conditioner head;
   a cleaning cup having a base and a wall extending upward from the base for receiving and cleaning the conditioner head; and
   a plurality of fluid dispensers to dispense a cleaning fluid onto the conditioner head and an arm that supports the conditioner head.

* * * * *